United States Patent
Arp et al.

(10) Patent No.: US 7,996,808 B2
(45) Date of Patent: Aug. 9, 2011

(54) COMPUTER READABLE MEDIUM, SYSTEM AND ASSOCIATED METHOD FOR DESIGNING INTEGRATED CIRCUITS WITH LOOP INSERTIONS

(75) Inventors: Andreas Arp, Nufringen (DE); Jeanne P. Bickford, Essex Junction, VT (US); Markus Buehler, Weil im Schoenbuch (DE); Juergen Koehl, Weil im Schoenbuch (DE); Philipp Salz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 12/146,921

(22) Filed: Jun. 26, 2008

(65) Prior Publication Data
US 2009/0031274 A1    Jan. 29, 2009

(30) Foreign Application Priority Data
Jul. 26, 2007   (EP) ..................................... 07113180

(51) Int. Cl.
*G06F 17/50* (2006.01)
(52) U.S. Cl. ......................... 716/126; 716/104; 716/107
(58) Field of Classification Search ................... 716/104, 716/107, 126
See application file for complete search history.

(56) References Cited

U.S. PATENT DOCUMENTS
| | | | |
|---|---|---|---|
| 6,898,770 B2 * | 5/2005 | Boluki et al. ................. | 716/112 |
| 7,739,630 B1 * | 6/2010 | Chen et al. .................... | 716/136 |
| 2006/0265684 A1 | 11/2006 | Buehler et al. | |

* cited by examiner

*Primary Examiner* — Thuan Do
(74) *Attorney, Agent, or Firm* — Cantor Colburn LLP; Dennis Jung

(57) ABSTRACT

A computer readable medium, system and associated method is provided for designing an integrated circuit with inserted loops. The method comprises the steps of inserting a loop with tagged wire segments and/or vias in a fully routed and DCR clean integrated circuit; performing a DRC; and fixing DRC violations by removing tagged wire segments and/or vias which contribute to a violation.

8 Claims, 3 Drawing Sheets

COMPUTER READABLE MEDIUM, SYSTEM AND ASSOCIATED METHOD FOR DESIGNING INTEGRATED CIRCUITS WITH LOOP INSERTIONS

BACKGROUND OF THE INVENTION

1. Field of the Invention

The present invention generally relates to the field of integrated circuit physical design. In particular, the present invention is directed to a method for designing an integrated circuit with inserted loops and a computer readable medium containing computer executable instructions as well as a system for designing an integrated circuit with inserted loops.

2. Description of Background

As the physical dimensions of VLSI (Very Large Scale Integrated Circuits) continue to shrink, it has become increasingly difficult to manufacture such integrated circuits in a reliable fashion. The sensitivity of a VLSI design to random defects increases as feature widths and spacing between features grow smaller. In addition, the presence of single vias, i.e. of inter-layer connectors through a single via, is particularly undesirable. From the perspective of random-defect yield, a single via is especially likely to cause a chip failure because a spot-defect landing on a single via will create an open circuit. From the perspective of systematic yield, if vias are difficult to manufacture in a given process, a poorly created single via can cause a circuit open or a highly resistive connection, which can cause a circuit to fail. New manufacturing processes are particularly sensitive to yield problems that are related to the formation of vias.

US 2006/0265684 A1 discloses an automated method for reducing integrated circuit design sensitivity to manufacturing defects and increasing integrated circuit reliability by using existing router technology to increase redundancy of inter-layer connectors, i.e. vias, and intra-layer connectors, e.g. wire segments, in order to enhance circuit reliability and yield. Once the initial routing is completed, single vias, i.e. single vias used to make an inter-layer connection, are identified. Then, a specific single via is selected and temporarily blocked. Specifically, the selected single via is marked within the routing program as not available for connecting a first element to a second element, the first and second elements being a wire, pin, device etc. The single via is also preferably coded as "must keep" so that the routing program will not remove the original single via in order to form another path. Then, the existing routing program identifies an available alternate route for a connection between the first and second elements and inserts a second path therein. The second path comprises a loop that extends from the first element to the second element and comprises at least one additional via and an additional intra-layer connector, e.g. a wire segment. Once the second path is inserted, the single via is unblocked. Thus, the first element and the second element are connected by both first and second paths, i.e. redundant paths. The process is repeated for each single via identified. These redundant paths are used to reduce the integrated circuit's sensitivity to manufacturing defects that may be caused by a potential block in the single via.

When implementing a method for reducing integrated circuit design sensitivity by using existing router technology to increase redundancy of inter-layer connectors, i.e. vias, and intra-layer connectors, e.g. wire segments; one is faced with several kinds of problems: DRC violations, e.g. a minimum of enclosed area violations, might be introduced by the router technology. Timing violations might be introduced as well because the resistance and the capacitance of the integrated circuit's nets are changed when loops are inserted. Especially the capacitance increase is not limited to nets where loops are inserted, but also comprises nets adjacent to the newly inserted segments forming the loop. ECO (Engineering Change Order) routing becomes much harder because the inserted loops consume routing space.

For these reasons, a need exists for improved structures for implementing redundant vias in an integrated circuit physical design process, in order to reduce the complexity of the manufacturing process, maintain high wiring density, and maximize manufacturing yield.

SUMMARY OF THE INVENTION

The shortcomings of the prior art are overcome and additional advantages are provided through the provision of a computer readable medium, system and associated method for designing an integrated circuit with inserted loops. The method comprises the steps of inserting a loop with tagged wire segments and/or vias in a fully routed and DCR clean integrated circuit; performing a DRC; and fixing DRC violations by removing tagged wire segments and/or vias which contribute to a violation.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
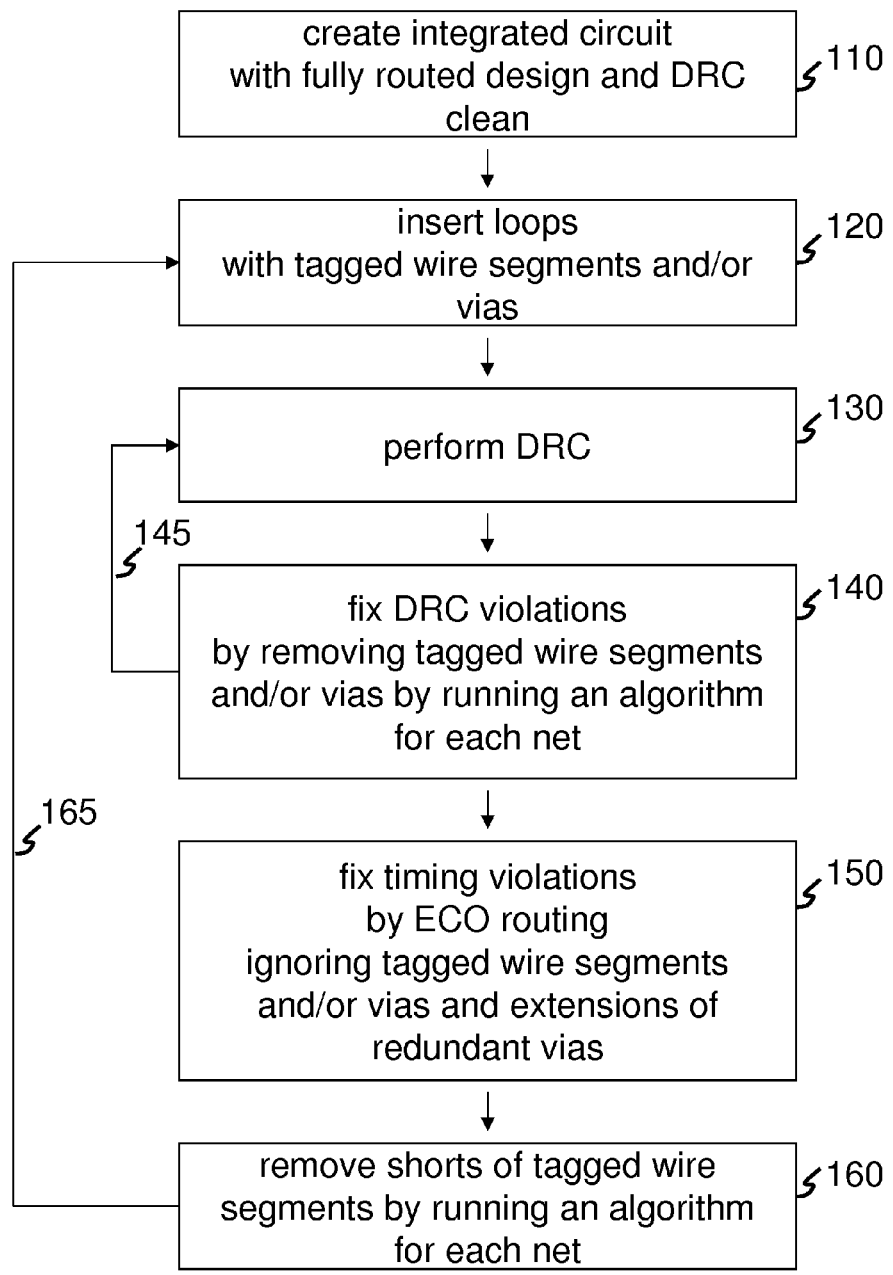
FIG. 1 is a flow diagram illustrating a method of loop insertion and fixing during post routing fixes in accordance with the invention.
Figure 2:
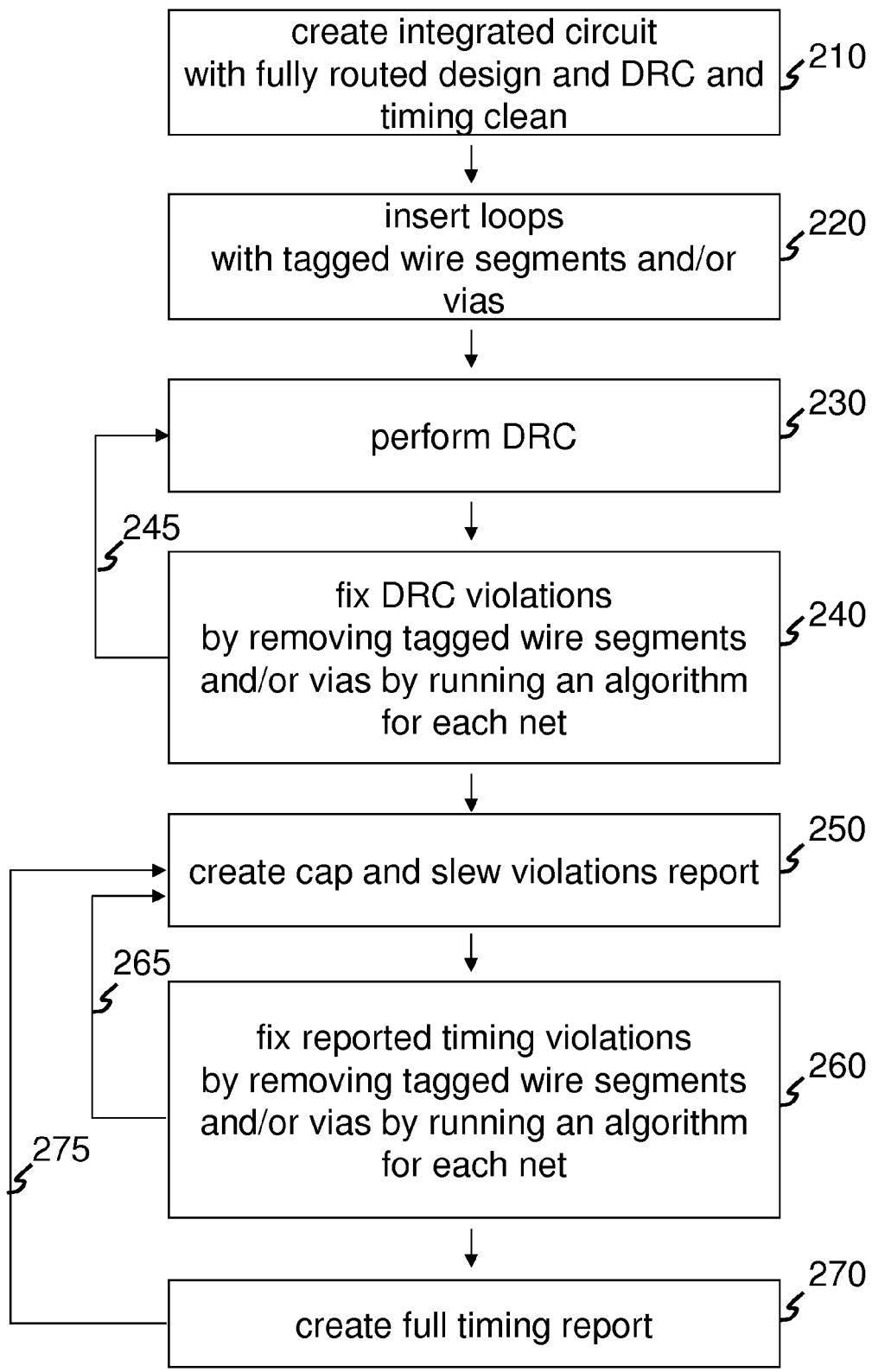
FIG. 2 is a flow diagram illustrating a method of loop insertion and fixing as a post process in accordance with the invention.

The physical design of an integrated circuit which is the starting point of both diagrams in FIG. 1 and FIG. 2 may be performed by use of any standard EDA (Electronic Design Automation) tool, such as the CADENCE® application, which performs standard place and route operations that are associated with an integrated circuit physical design process.

FIG. 1 illustrates a method of loop insertion and fixing during post routing fixes. Starting point 110 is a fully routed and DRC clean but not necessarily timing clean integrated circuit which may include redundant vias.

In a following step 120 a router program, such as one that may exist in the prior art as appreciated by one skilled in the art, is modified such that new loops are inserted with tagged wire segments and/or vias.

In a next step 130 a DRC is performed on a given data format, e.g. gds2 or symbolic data.

In step 140 DRC violations are fixed by an algorithm which checks whether a tagged segment and/or via contributes to a violation. If this is the case the tagged segment and/or via is removed.

In an optional step which is not illustrated in FIG. 1 antennas are removed because an antenna may create charging problems and/or electro-migration problems. An "antenna check" may be performed by any or all inserted, i.e. tagged, loops by an algorithm. The antenna check may be a standard verification operation of any EDA application.

A DRC routine according to steps 130 and 140 may be repeated as illustrated by arrow 145 until no violation left is caused by a loop insertion. The repetition may be performed by an algorithm checking for each net in a design and for each violation in the net whether a tagged segment and/or via contributes to the violation.

As an alternative or in addition there may also be performed an algorithm which checks for each net in a design and for each tagged segment and/or via in the net whether it contributes to a violation.

In a step 150 timing violations are fixed based on standard approaches like repeater insertion, gate sizing, rewiring etc. Ideally, loop insertion is started when most timing violations are fixed. But there can still be some violations left. Typically a few thousand violations left are acceptable. The timing violations are fixed including ECO routing. Loops substantially aggravate ECO routing since they tend to block routing tracks. The result will be long routing times due to rip up sequences and/or routing fails.

Assuming that all inserted loops are tagged, the following extension to the ECO routing tool circumvents the above mentioned problems:

Normal manual or automatic ECO routing is performed, but tagged wire segments and/or vias are ignored. Thus shorts or minimum space violations are created. In case of automatic routing, these violations can be associated with an extra cost. Then the router will search for an alternative, possibly longer route before creating a violation to a tagged wire segment and/or via or an extension of a redundant via.

An extension of a redundant via is defined as that part of the redundant via that needs to be added to a single via to make it redundant.

After all ECO connections have been completed, shorts to inserted loops are removed according to step 160 by an algorithm which checks whether a tagged segment and/or via and/or an extension of a redundant via contributes to the short or space violation. If this is the case the tagged segment and/or via and/or the extension of a redundant via is removed.

The routine according to step 160 may be repeated until no violation left is caused by a loop insertion. The repetition may be performed by an algorithm checking for each net in a design and for each violation in the net whether a tagged segment and/or via and/or an extension of a redundant via contributes to the violation.

As an alternative or in addition there may also be performed an algorithm which checks for each net in a design and for each tagged segment and/or via and/or extension of a redundant via in the net whether it contributes to a violation.

The sequence comprising the step 120 of inserting new loops with tagged wire segments and/or vias followed by the step 130 of DRC, the step 140 of fixing DRC violations, the step 150 of fixing timing violations and the step 160 of removing shorts of tagged wire segments as described above can be repeated as illustrated by arrow 165.

Advantages of the embodiment as illustrated in FIG. 1 are a minimum TAT adder, a 100% clean design in the end, a maximum number of loops in the design and ECO routing to be performed easily.

FIG. 2 illustrates a method of loop insertion and fixing as a post process. Starting point 210 is a fully routed, DRC and timing clean integrated circuit.

In a following step 220 and in correspondence to the process as illustrated in FIG. 1 a router program is modified such that new loops are inserted with tagged wire segments and/or vias.

Then in a next step 230 a DRC is performed on a given data format.

In step 240 DRC violations are fixed by an algorithm which checks whether a tagged segment and/or via contributes to the violation. If this is the case the tagged segment and/or via is removed.

Optionally antennas are removed as described for the process in FIG. 1.

A DRC routine according to steps 230 and 240 may be performed analogously to the routine according to the steps 130 and 140 in FIG. 1 as illustrated by arrow 245.

A further option is to exclude critical nets from loop insertion, e.g. nets with slack limits or clocks. Typical values for slack limits are 10 to 30 picoseconds.

In a further step 250 a first cap (capacitance) and slew violations report is created and in a next step 260 all tagged wire segments and/or vias having a violation according to this first report are removed.

By repeating step 250 a new cap and slew violations report is created and all nets having a violation according to this new report are considered. These new violations are caused by the capacity increase due to adjacent tagged loop segments and/or vias. The violations are fixed by repeating step 260. The repetition of the steps 250 and 260 is illustrated by arrow 265.

If nets having a violation according to the new report exist adjacent tagged loop segments and/or vias and/or antennas in a first neighborhood of the nets are removed. First neighborhood means within a distance of "1 track" from the net. If in a further new report there are still violations the removal is performed within a neighborhood with distance "2 tracks" and so on. The algorithm is stopped when a distance limit is reached, e.g. a distance limit of "7 tracks", and a full variation aware timing report is created.

If no nets having a violation according to the new report exist a full variation aware timing report is created in step 270.

The full variation aware timing report is usually clean or has only negligible timing violations. If not, a similar approach as described above can be used, but a cap and slew violations report must be replaced by a full timing report as illustrated by arrow 275. Nevertheless, many steps of iteration should be avoided due to extremely long runtimes of full variation aware timing.

Advantages of the embodiment as illustrated in FIG. 2 are that it is easier to implement because it requires only a minor enhancement in a routing tool and is less disruptive to existing flows. But ECO routing after loop insertion is hard, a 100% timing cleanness cannot be guaranteed and the TAT adder is higher than in the process according to FIG. 1.

It is to be noted that the aspects and embodiments described herein may be conveniently implemented using a machine, e.g. a general purpose computing device, programmed according to the teachings of the present specification, as will be apparent to those skilled in the computer art. Appropriate software coding can readily be prepared by skilled programmers based on the teachings of the present disclosure, as will be apparent to those skilled in the software art.

Such software may be a computer program product that employs a machine-readable medium. A machine-readable medium may be any medium that is capable of storing and/or encoding a sequence of instructions for execution by a machine, e.g. a general purpose computing device and that causes the machine to perform any one of the methodologies and/or embodiments described herein. Examples of a machine-readable medium include, but are not limited to, a magnetic disk, e.g. a conventional floppy disk, a hard drive disk, an optical disk, e.g. a compact disk "CD", such as a readable, writeable, and/or re-writable CD; a digital video disk "DVD", such as a readable, writeable, and/or rewritable DVD, a magneto-optical disk, a read-only memory "ROM" device, a random access memory "RAM" device, a magnetic card, an optical card, a solid-state memory device, e.g. a flash memory, an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

Examples of a general purpose computing device include, but are not limited to, a computer workstation, a terminal computer, a server computer, a handheld device, e.g. tablet computer, a personal digital assistant "PDA", a mobile telephone etc., a web appliance, a network router, a network switch, a network bridge, any machine capable of executing a sequence of instructions that specify an action to be taken by that machine, and any combinations thereof. In one example, a general purpose computing device may include and/or be included in a kiosk.

Figure 3:
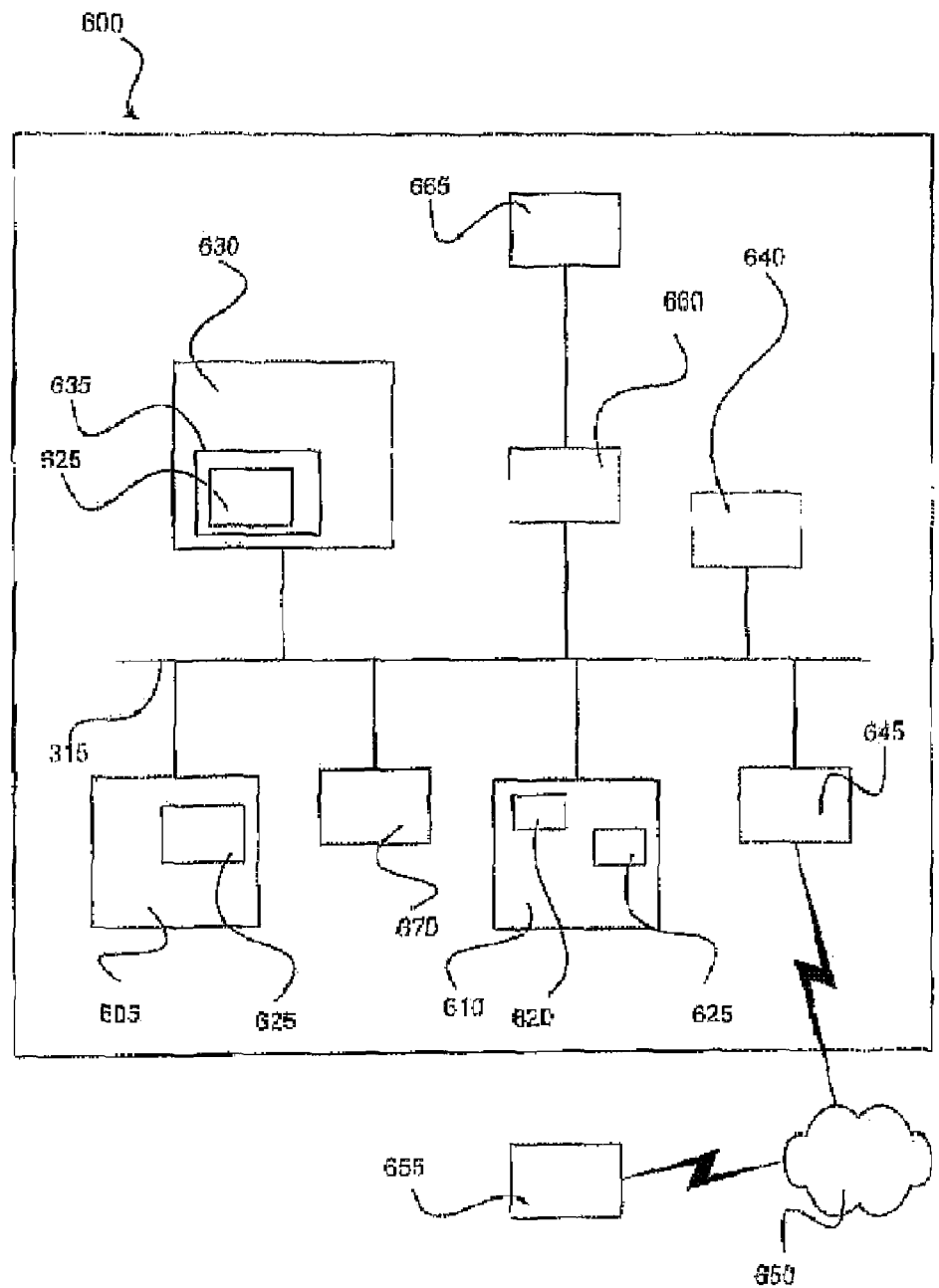
FIG. 3 is a schematic diagram illustrating a system of the present invention.

FIG. 3 shows a diagrammatic representation of one embodiment of a general purpose computing device in the exemplary form of a computer system 600 within which a set of instructions for causing the device to perform any one or more of the aspects and/or methodologies of the present disclosure may be executed. Computer system 600 includes a processor 605 and a memory 610 that communicate with each other, and with other components, via a bus 315. Bus 315 may include any of several types of bus structures including, but not limited to, a memory bus, a memory controller, a peripheral bus, a local bus, and any combinations thereof, using any of a variety of bus architectures.

Processor 605 may include a router (not shown) for identifying available routes and for inserting intra-layer connectors, e.g. wire segments and inter-layer connectors, i.e. vias into the available routes to form connecting paths.

Processor 605 may comprise an identifier (not shown) which identifies single vias in previously routed connecting paths, e.g. a single via in a first path connecting a first element and a second element, the first and second elements being a wire, pin, device etc.

Processor 605 may further comprise a diverter (not shown) which blocks a selected single via so that it is not recognized by the router as a connection between a first element and a second element. In other words, the diverter tricks the router into proceeding as if the single via is not available for use in connecting the first element to the second element. The router is further adapted to determine an alternate path, i.e. second path, for connecting a first element and a second element when the single via is blocked and for inserting the path.

Processor 605 may also comprise a controller (not shown) which controls the router by placing limitations on the second path which may be used. For example, the controller may be adapted to restrict the second path to within an area between and within the metal layers used by the first path and/or to within a predetermined distance from the single via. The controller may also restrict the router from ripping up existing vias in order to form the second path. Additionally, the controller may be adapted to conduct a cost-benefit analysis and to only insert the second path if a benefit of inserting the second path outweighs a cost of inserting the second path.

Memory 610 may include various components, e.g. machine readable media, including, but not limited to, a random access memory component, e.g. a static RAM "SRAM", a dynamic RAM "DRAM" etc., a read only component, and any combinations thereof. In one example, a basic input/output system 620 (BIOS), including basic routines that help to transfer information between elements within computer system 600, such as during start-up, may be stored in memory 610. Memory 610 may also include, e.g. stored on one or more machine-readable media, instructions, e.g. software, 625 embodying any one or more of the aspects and/or methodologies of the present disclosure. In another example, memory 610 may further include any number of program modules including, but not limited to, an operating system, one or more application programs, other program modules, program data, and any combinations thereof.

Computer system 600 may also include a storage device 630. Examples of a storage device, e.g. storage device 630, include, but are not limited to, a hard disk drive for reading from and/or writing to a hard disk, a magnetic disk drive for reading from and/or writing to a removable magnetic disk, an optical disk drive for reading from and/or writing to an optical media, e.g. a CD, a DVD etc., a solid-state memory device, and any combinations thereof. Storage device 630 may be connected to bus 315 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 630 may be removably interfaced with computer system 600, e.g. via an external port connector (not shown). Particularly, storage device 630 and an associated machine-readable medium 635 may provide nonvolatile and/or volatile storage of machine-readable instructions, data structures, program modules, and/or other data for computer system 600. In one example, software 625 may reside, completely or partially, within machine-readable medium 635. In another example, software 625 may reside, completely or partially, within processor 605.

Computer system 600 may also include an input device 640. In one example, a user of computer system 600 may enter commands and/or other information into computer system 600 via input device 640. Examples of an input device 640 include, but are not limited to, an alpha-numeric input device, e.g. a keyboard, a pointing device, a joystick, a game pad, an audio input device, e.g. a microphone, a voice response system etc., a cursor control device, e.g. a mouse, a touchpad, an optical scanner, a video capture device, e.g. a still camera, a video camera, touch screen, and any combinations thereof. Input device 640 may be interfaced to bus 315 via any of a variety of interfaces (not shown) including, but not limited to, a serial interface, a parallel interface, a game port, a USB interface, a FIREWIRE interface, a direct interface to bus 315, and any combinations thereof.

A user may also input commands and/or other information to computer system 600 via storage device 630, e.g. a removable disk drive, a flash drive etc., and/or a network interface device 645. A network interface device, such as network interface device 645 may be utilized for connecting computer system 600 to one or more of a variety of networks, such as network 650, and one or more remote devices 655 connected thereto. Examples of a network interface device include, but are not limited to, a network interface card, a modem, and any combination thereof. Examples of a network include, but are not limited to, a wide area network, e.g. the Internet, an enterprise network, a local area network, e.g. a network associated with an office, a building, a campus or other relatively small geographic space, a telephone network, a direct connection between two computing devices, and any combinations thereof. A network, such as network 650, may employ a wired and/or a wireless mode of communication. In general, any network topology may be used. Information, e.g. data, software 625 etc., may be communicated to and/or from computer system 600 via network interface device 645.

Computer system 600 may further include a video display adapter 660 for communicating a displayable image to a display device, such as display device 665. Examples of a display device include, but are not limited to, a liquid crystal display (LCD), a cathode ray tube (CRT), a plasma display, and any combinations thereof. In addition to a display device, a computer system 600 may include one or more other peripheral output devices including, but not limited to, an audio speaker, a printer, and any combinations thereof. Such peripheral output devices may be connected to bus 315 via a peripheral interface 670. Examples of a peripheral interface include, but are not limited to, a serial port, a USB connection, a FIREWIRE connection, a parallel connection, and any combinations thereof.

A digitizer (not shown) and an accompanying pen/stylus, if needed, may be included in order to digitally capture freehand input. A pen digitizer may be separately configured or coextensive with a display area of display device 665. Accordingly, a digitizer may be integrated with display device 665, or may exist as a separate device overlaying or otherwise appended to display device 665.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer-implemented method for designing an integrated circuit with inserted loops comprising the steps of:
    receiving a routing description at a computing device of an integrated circuit that is fully routed and design rule check (DRC) clean;
    inserting a loop in the routing description to form a modified routing description, the loop connecting two elements that were connected together by a first path in the routing description by a second path and being formed with tagged wire segments;
    performing a DRC on the modified routing description;
    fixing DRC violations by removing tagged wire segments which contribute to a violation.

2. The method of claim 1, further comprising the step of tagging the wire segments with a special wire type.

3. The method of claim 1, further comprising a step during which an antenna is removed.

4. The method of claim 1, further comprising a step of fixing timing violations of the modified routing description.

5. The method of claim 4, further comprising:
    fixing timing violations including ECO (Engineering Change Order) routing ignoring tagged wire segments;
    removing shorts to tagged wire segments.

6. The method of claim 4, wherein the integrated circuit is timing clean.

7. The method of claim 6, further comprising:
    fixing timing violations by removing tagged wire segments which contribute to a violation.

8. A computer readable medium containing computer executable instructions for designing an integrated circuit with inserted loops comprising:
    receiving a routing description at a computing device of the integrated circuit that is fully routed and design rule check (DRC) clean;
    inserting a loop in the routing description to form a modified routing description, the loop connecting two elements that were connected together by a first path in the routing description by a second path and being formed with tagged wire segments;
    performing a DRC on the modified routing description;
    fixing DRC violations by removing tagged wire segments which contribute to a violation.

* * * * *